United States Patent
Kato

(10) Patent No.: US 8,062,960 B2
(45) Date of Patent: Nov. 22, 2011

(54) COMPOUND SEMICONDUCTOR DEVICE AND METHOD OF MANUFACTURING COMPOUND SEMICONDUCTOR DEVICE

(75) Inventor: Kazuhiro Kato, Ichihara (JP)

(73) Assignee: Showa Denko K.K., Tokyo (JP)

( * ) Notice: Subject to any disclaimer, the term of this patent is extended or adjusted under 35 U.S.C. 154(b) by 182 days.

(21) Appl. No.: 12/374,955

(22) PCT Filed: Feb. 13, 2008

(86) PCT No.: PCT/JP2008/052318
§ 371 (c)(1),
(2), (4) Date: Nov. 24, 2009

(87) PCT Pub. No.: WO2008/099838
PCT Pub. Date: Aug. 21, 2008

(65) Prior Publication Data
US 2011/0128980 A1    Jun. 2, 2011

(30) Foreign Application Priority Data

Feb. 14, 2007 (JP) ................ P2007-033523

(51) Int. Cl.
*H01L 21/00* (2006.01)
*H01L 21/50* (2006.01)
*H01L 21/46* (2006.01)
*H01L 21/78* (2006.01)

(52) U.S. Cl. ............ 438/462; 438/22; 438/33; 438/46; 438/68; 438/463; 257/E21.002; 257/E21.237; 257/E21.238; 257/E21.599; 257/E21.6

(58) Field of Classification Search .......... 257/E21.002, 257/E21.238, E21.237, E21.6
See application file for complete search history.

(56) References Cited

U.S. PATENT DOCUMENTS

| | | | |
|---|---|---|---|
| 4,356,210 A | 10/1982 | Imai et al. | |
| 4,435,443 A | 3/1984 | Imai et al. | |
| 7,511,314 B2 * | 3/2009 | Yamada et al. | 257/101 |
| 2006/0205229 A1 * | 9/2006 | Nonaka et al. | 438/767 |
| 2007/0205490 A1 * | 9/2007 | Kusunoki | 257/620 |
| 2008/0070380 A1 * | 3/2008 | Kusunoki | 438/462 |

FOREIGN PATENT DOCUMENTS

| | | |
|---|---|---|
| JP | 55-075281 A | 6/1980 |
| JP | 06-283758 A | 10/1994 |
| JP | 11-177137 A | 7/1999 |
| JP | 2000-124537 A | 4/2000 |
| JP | 2002-252185 A | 9/2002 |
| JP | 3449201 B2 | 7/2003 |
| JP | 2006-024914 A | 1/2006 |
| WO | 2005/122223 A1 | 12/2005 |

* cited by examiner

*Primary Examiner* — Mohsen Ahmadi
(74) *Attorney, Agent, or Firm* — Sughrue Mion, PLLC

(57) ABSTRACT

The present invention provides a method of manufacturing a compound semiconductor device capable of improving yield when a wafer is divided into device regions. The method of manufacturing a compound semiconductor device includes a division step. The division step includes: a first division step of dividing a wafer 30 in a first direction α to obtain first strip wafers each having at least two rows of device portions 10 arranged in the first direction α; a second division step of dividing the first strip wafer in a second direction β to obtain second strip wafers each having a row of the device portions 10 arranged in the second direction β; and a third division step of dividing the second strip wafer into the device portions 10, thereby forming compound semiconductor devices including the device portions 10.

6 Claims, 6 Drawing Sheets

US 8,062,960 B2

COMPOUND SEMICONDUCTOR DEVICE AND METHOD OF MANUFACTURING COMPOUND SEMICONDUCTOR DEVICE

TECHNICAL FIELD

The present invention relates to a compound semiconductor device and a method of manufacturing a compound semiconductor device, and more particularly, to a method of manufacturing a compound semiconductor device capable of improving yield when a wafer is divided into device portions to form compound semiconductor devices and to a compound semiconductor device manufactured by the manufacturing method.

Priority is claimed on Japanese Patent Application No. 2007-033523, filed Feb. 14, 2007, the content of which is incorporated herein by reference.

BACKGROUND ART

In recent years, a semiconductor light-emitting device, such as a p-n junction light-emitting diode (LED) or a laser diode (LD), has been known as a compound semiconductor device. In the light-emitting device, when a group-III nitride semiconductor ($Al_xGa_yIn_zN$: $0 \leq x \leq 1$, $0 \leq y \leq 1$, $0 \leq z \leq 1$, and $x+y+z=1$) is used for a light-emitting layer, it is possible to obtain a light-emitting device that emits near ultraviolet light, blue light, or green light. In the group-III nitride semiconductor light-emitting device, generally, a substrate is formed of an electric insulating sapphire ($\alpha$-$Al_2O_3$) single crystal. However, the substrate may be formed of a silicon carbide (SiC).

The compound semiconductor device is generally manufactured by forming a wafer having a plurality of compound semiconductor devices arranged in a predetermined pattern on a substrate and dividing the wafer into compound semiconductor devices. In general, a die saw or a scriber is used to divide the wafer. The die saw cuts the wafer by rotating a disk-shaped blade (dicing blade) having a diamond tip. The scriber forms very fine linear grooves (scribe lines) in a wafer, for example, in a lattice shape using a diamond stylus and applies external force to divide the wafer.

However, when a semiconductor light-emitting device having an epitaxial layer made of a group-III nitride semiconductor formed on a sapphire substrate is manufactured, a large distortion occurs in the interface between the group-III nitride semiconductor layer and the sapphire substrate due to a large difference between the lattice constants of the group-III nitride semiconductor layer and the sapphire substrate. In addition, since the sapphire substrate has a hexagonal crystal structure, it does not have a cleavage property. Both the sapphire substrate and the group-III nitride semiconductor have a Mohs hardness of about 9, which is a very high level. Therefore, it is difficult to divide the sapphire substrate having the group-III nitride semiconductor light-emitting device structure formed thereon using the scriber to manufacture semiconductor light-emitting devices having a regular shape with high yield. When the sapphire substrate having the group-III nitride semiconductor light-emitting device structure formed thereon is divided by the die saw, a crack or chipping is more likely to occur in a cutting plane, and it is difficult to clearly divide the substrate. As a result, the group-III nitride semiconductor layer is likely to be peeled off from the sapphire substrate.

Further, a scribing method using a laser beam has been proposed (for example, see Patent Documents 1, 2, and 3). When a laser beam is radiated onto a wafer for a group-III nitride semiconductor light-emitting device to form division grooves in the wafer, it is possible to improve yield or productivity, and effectively and clearly form division grooves.

Furthermore, it has been known that a wafer having a gallium nitride compound semiconductor formed on a sapphire substrate is curved due to the difference between the lattice constants or the thermal expansion coefficients of the compound semiconductor and the sapphire substrate (for example, see Patent Document 4).

[Patent Document 1] Japanese Patent No. 3449201
[Patent Document 2] JP-A-11-177137
[Patent Document 3] JP-A-2006-24914
[Patent Document 4] JP-A-06-283758

DISCLOSURE OF THE INVENTION

Problems to be Solved by the Invention

When a laser beam is radiated onto the wafer for a group-III nitride semiconductor light-emitting device to form the division grooves, it is possible to effectively and clearly form the division grooves. However, when external force is applied to divide the wafer, it is difficult to accurately divide the wafer due to distortion in the interface between the substrate and the compound semiconductor formed on the substrate or the bending of the wafer caused by the distortion. As a result, it is difficult to manufacture compound semiconductor devices having a regular shape with high yield. In particular, in a wafer having a group-III nitride semiconductor formed on a sapphire substrate, a large distortion occurs in the interface between the group-III nitride semiconductor and the sapphire substrate or the wafer is greatly curved. As a result, the above problems become significant.

The present invention has been made in order to solve the above problems, and an object of the present invention is to provide a method of manufacturing a compound semiconductor device capable of improving yield when a wafer is divided into device portions to form compound semiconductor devices.

Another object of the present invention is to provide compound semiconductor devices having a regular shape manufactured by the manufacturing method.

Means for Solving the Problems

In order to solve the above problems, the inventors have conducted studies on the relationship between the order in which boundaries are cut and yield, when a wafer having a plurality of device portions formed on a substrate in a matrix is divided into a plurality of compound semiconductor devices along lattice-shaped boundaries that partition the wafer into device portions.

The studies proved that, first, when the wafer was divided along the boundaries arranged in a first direction among the boundaries provided in a lattice shape on the wafer, the obtained strip-shaped device block was greatly curved due to distortion of the substrate, and when the obtained strip-shaped device block was divided into device portions in a second direction orthogonal to the first direction, cracks occurred in an unintended direction, and the wafer was not accurately divided.

The inventors have conducted studies in order to solve the above problems and found that a wafer is divided into first strip wafers along some of the boundaries arranged in a first direction among the boundaries provided in a lattice shape, the obtained first strip wafer is divided into second strip wafers, each having a row of device portions arranged in a second direction orthogonal to the first direction, and the second strip wafer is divided into the device portions in the first direction, thereby reducing the distortion of a substrate of the strip wafer divided in the second direction, by which the present invention was achieved. The present invention is as follows.

According to a first aspect of the present invention, a method of manufacturing a compound semiconductor device includes: a device forming step of forming a plurality of device portions on a main surface of a substrate in a matrix in a first direction and a second direction that is orthogonal to the first direction, thereby forming a wafer; and a division step of dividing the wafer into the device portions, thereby forming compound semiconductor devices. The division step includes: a first division step of dividing the wafer in the first direction to obtain first strip wafers each having at least two rows of the device portions arranged in the first direction; a second division step of dividing the first strip wafer in the second direction to obtain second strip wafers each having a row of the device portions arranged in the second direction; and a third division step of dividing the second strip wafer into the device portions, thereby forming the compound semiconductor devices including the device portions.

According to a second aspect of the present invention, preferably, the method of manufacturing a compound semiconductor device according to the first aspect further includes a partition step of forming half cut grooves for separating the device portions in the main surface of the substrate in the first and second directions, between the device forming step and the division step.

According to a third aspect of the present invention, in the method of manufacturing a compound semiconductor device according to the second aspect, preferably, the half cut grooves are formed by a laser method.

According to a fourth aspect of the present invention, in the method of manufacturing a compound semiconductor device according to the second or third aspect, preferably, in the division step, a knife is pressed against the wafer along the half cut grooves such that cracks occur along the half cut grooves, thereby dividing the wafer into the first strip wafers or the second strip wafers.

According to a fifth aspect of the present invention, in the method of manufacturing a compound semiconductor device according to any one of the first to fourth aspects, preferably, the first strip wafer includes two to five rows of the device portions arranged in the first direction.

According to a sixth aspect of the present invention, in the method of manufacturing a compound semiconductor device according to any one of the first to fifth aspects, preferably, the substrate is a sapphire substrate, the main surface is a C-plane, and the first direction is vertical to a (11-20) plane.

According to a seventh aspect of the present invention, preferably, the method of manufacturing a compound semiconductor device according to any one of the first to sixth aspects further includes a step of polishing a surface of the substrate opposite to the main surface such that the thickness of the substrate is in the range of 60 μm to 90 μm, before the division step.

According to an eighth aspect of the present invention, in the method of manufacturing a compound semiconductor device according to any one of the first to seventh aspects, preferably, the compound semiconductor device is a group-III nitride semiconductor light-emitting device.

According to a ninth aspect of the present invention, a compound semiconductor device is manufactured by the method of manufacturing a compound semiconductor device according to any one of the first to eighth aspects.

Advantages of the Invention

In the method of manufacturing a compound semiconductor device according to the present invention, the division step includes a first division step of dividing the wafer in the first direction to obtain first strip wafers each having at least two rows of the device portions arranged in the first direction; a second division step of dividing the first strip wafer in the second direction to obtain second strip wafers each having a row of the device portions arranged in the second direction; and a third division step of dividing the second strip wafer into the device portions, thereby forming the compound semiconductor devices including the device portions. Therefore, it is possible to reduce the distortion of the substrate when the wafer is divided in the second direction, which will be described below, as compared to when the wafer is divided into strip-shaped device blocks, each having a row of device portions arranged in the first direction.

That is, in the present invention, the first strip wafer divided in the second division step has at least two rows of device portions arranged in the first direction. Therefore, the width of the strip wafer in the second direction is larger than that of the strip device block having a row of device portions arranged in the first direction. In the first strip wafer according to the present invention, the distortion of the substrate in the first direction is dispersed by a portion extending in the second direction. Therefore, in the present invention, the bending of the first strip wafer divided in the second division step is reduced, and the wafer with a small curvature is divided in the entire division step, which makes it possible to accurately divide the wafer. As a result, according to the present invention, it is possible to obtain compound semiconductor devices having a regular shape, and improve yield in the division step.

Further, since the compound semiconductor device according to the present invention is obtained by the method of manufacturing a compound semiconductor device, it is possible to obtain compound semiconductor devices having a regular shape.

BEST MODE FOR CARRYING OUT THE INVENTION

Hereinafter, a compound semiconductor device and a method of manufacturing a compound semiconductor device according to an embodiment of the present invention will be described with reference to the accompanying drawings.

In this embodiment of the present invention, as an example of a method of manufacturing a compound semiconductor device, a method of manufacturing a group-III nitride semiconductor light-emitting device will be described. In this embodiment, in order to manufacture a group-III nitride semiconductor light-emitting device, first, a plurality of LED device structures (device portions) are formed on a main surface of a substrate, thereby manufacturing a wafer.

(Device Forming Process)

Figure 1:
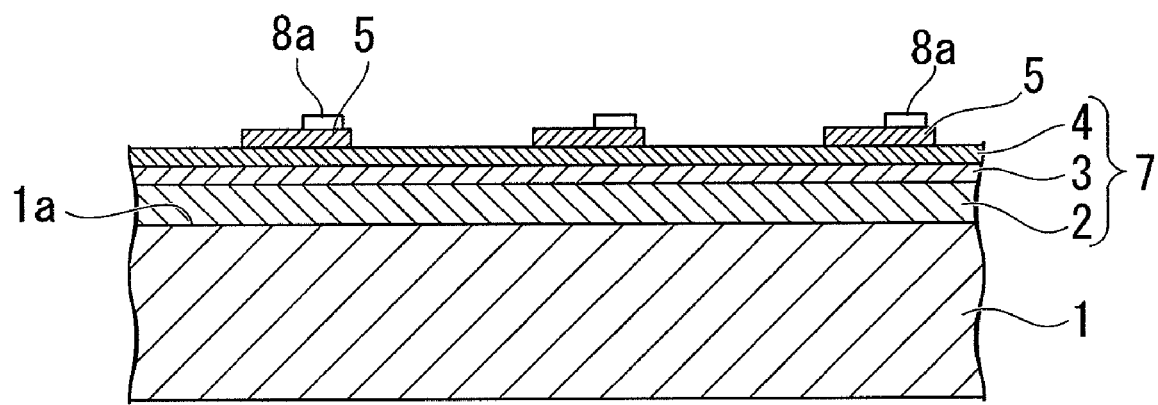
FIG. 1 is a cross-sectional view schematically illustrating a process of a method of manufacturing a nitride semiconductor light-emitting device according to an embodiment of the present invention.

FIG. 1 is a cross-sectional view schematically illustrating a process of the method of manufacturing the group-III nitride semiconductor light-emitting device according to this embodiment. In a device forming process, first, as shown in FIG. 1, an epitaxial layer 7 made of a group-III nitride semiconductor is formed on a main surface 1a of a substrate 1.

The substrate 1 may be formed of, for example, a sapphire single crystal or a SiC single crystal. When a sapphire substrate is used as the substrate 1, it is preferable that the (0001) C-plane be used as the main surface (front surface). An offset angle between the surface of the substrate 1 and a crystal plane may be 0°, or an offset angle may be formed therebetween.

When the epitaxial layer 7 made of a group-III nitride semiconductor is formed on the substrate 1, the thickness of the substrate 1 is preferably in the range of 250 to 1000 μm. If the thickness of the substrate 1 is less than 250 μm, the substrate 1 is turned over during the deposition of the epitaxial layer. On the other hand, if the thickness of the substrate 1 is more than 1000 μm, much labor is required to polish the substrate after the epitaxial layer is formed.

When the epitaxial layer 7 made of a group-III nitride semiconductor is formed on the substrate 1, it is preferable that the epitaxial layer 7 be formed on the substrate 1 with a buffer layer (not shown) and an underlying layer (not shown) formed on the buffer layer interposed therebetween.

The buffer layer is formed of an aggregate of columnar crystals of a group-III nitride semiconductor. The buffer layer is provided in order to protect the substrate 1 from a high-temperature chemical reaction and reduce the difference between the lattice constants of the substrate 1 and the epitaxial layer 7.

The underlying layer is formed of a group-III nitride semiconductor, and the material forming the underlying layer may be the same as or different from that forming the buffer layer. The underlying layer may be doped with an n-type dopant, such as Si, Ge, or Sn, if necessary, or it may be undoped. It is preferable that the underlying layer be undoped in order to maintain high crystallinity.

As shown in FIG. 1, the epitaxial layer 7 made of a group-III nitride semiconductor includes an n-type layer 2 including an n-type contact layer for forming an n-type electrode, a light-emitting layer 3 serving as a light-emitting portion, and a p-type layer 4 including a p-type contact layer for forming a p-type electrode.

In general, the n-type layer 2 includes an n-type contact layer and an n-type clad layer. The n-type contact layer may also serve as the n-type clad layer.

It is preferable that the n-type contact layer be formed of $Al_xGa_{1-x}N$ ($0 \leqq x < 1$, preferably, $0 \leqq x \leqq 0.5$, more preferably, $0 \leqq x \leqq 0.1$). The n-type contact layer is preferably doped with an n-type dopant. For example, Si, Ge, and Sn, preferably, Si and Ge are used as the n-type dopant.

It is preferable to provide the n-type clad layer between the n-type contact layer and the light-emitting layer 3. The n-type clad layer may be formed of AlGaN, GaN, or GaInN.

The light-emitting layer 3 formed on the n-type layer 2 has, for example, a single quantum well structure or a multiple quantum well structure. As a well layer having a quantum well structure, generally, a group-III nitride semiconductor layer formed of $Ga_{1-y}In_yN$ ($0 < y < 0.4$) is used. In the case of the light-emitting layer 3 having the multiple quantum well structure, a well layer is formed of $Ga_{1-y}In_yN$, and a barrier layer is formed of $Al_xGa_{1-x}N$ ($0 \leqq x < 0.3$) having a band gap energy that is higher than that of the well layer. The well layer and the barrier layer may be doped with a dopant or they may be undoped according to the design.

In general, the p-type layer 4 includes a p-type clad layer and a p-type contact layer. The p-type contact layer may also serve as the p-type clad layer.

The p-type clad layer is not particularly limited as long as it has a composition that has a band gap energy higher than that of the light-emitting layer 3 and can confine carriers in the light-emitting layer 3. It is preferable that the p-type clad layer be formed of $Al_xGa_{1-x}N$ ($0 < x \leqq 0.4$). When the p-type clad layer is formed of AlGaN, it is possible to confine carriers in the light-emitting layer.

The p-type dopant concentration of the p-type clad layer is preferably in the range of $1 \times 10^{18}$ to $1 \times 10^{21}/cm^3$, more preferably, $1 \times 10^{19}$ to $1 \times 10^{20}/cm^3$.

It is preferable that the p-type contact layer be formed of $Al_xGa_{1-x}N$ ($0 \leqq x \leqq 0.4$).

When the Al composition is within the above range, it is possible to maintain high crystallinity and low ohmic contact resistance with a p-type ohmic electrode. When the p-type dopant concentration of the p-type contact layer is in the range of $1 \times 10^{18}$ to $1 \times 10^{21}/cm^3$, preferably, $5 \times 10^{19}$ to $5 \times 10^{20}/cm^3$, it is possible to maintain low ohmic contact resistance, prevent the occurrence of cracks, and maintain high crystallinity. The p-type dopant is not particularly limited, but it is preferable that the p-type dopant be Mg.

For example, an MOCVD (metal organic chemical vapor deposition) method, an HVPE (hydride vapor phase epitaxy) method, an MBE (molecular beam epitaxy) method, or a sputtering method may be used to grow the epitaxial layer 7 made of a group-III nitride semiconductor on the substrate 1. The MOCVD method is preferable in terms of the control of the thickness of a film and mass production.

When the MOCVD method is used to grow a group-III nitride semiconductor, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonia ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, that is, organic germanium compounds, are used as n-type dopants, and Mg-based materials, such as bis-cyclopentadienylmagnesium ($Cp_2Mg$) and bisethylcyclopentadienyl magnesium (($EtCp)_2Mg$), are used as p-type dopants.

In this way, after the epitaxial layer 7 made of a group-III nitride semiconductor is formed on the substrate 1, a translucent positive electrode 5 is formed on the p-type layer 4 of the epitaxial layer 7 at a predetermined position by a known photolithography technique and a known lift-off technique, as shown in FIG. 1. The translucent positive electrode 5 may be formed of, for example, ITO ($In_2O_3$—$SnO_2$), AZnO (ZnO—$Al_2O_3$), IZnO ($In_2O_3$—ZnO), or GZO (ZnO—$Ga_2O_3$). In addition, the translucent positive electrode 5 may have any known structure, without any restrictions.

Then, as shown in FIG. 1, a positive electrode bonding pad 8a is formed on the translucent positive electrode 5 at a predetermined position by a known photolithography technique. The positive electrode bonding pad 8a may be formed of various known materials, such as Au, Al, Ni, and Cu. However, the known materials and the structure of the positive electrode bonding pad 8a are not particularly limited.

Figure 2A:
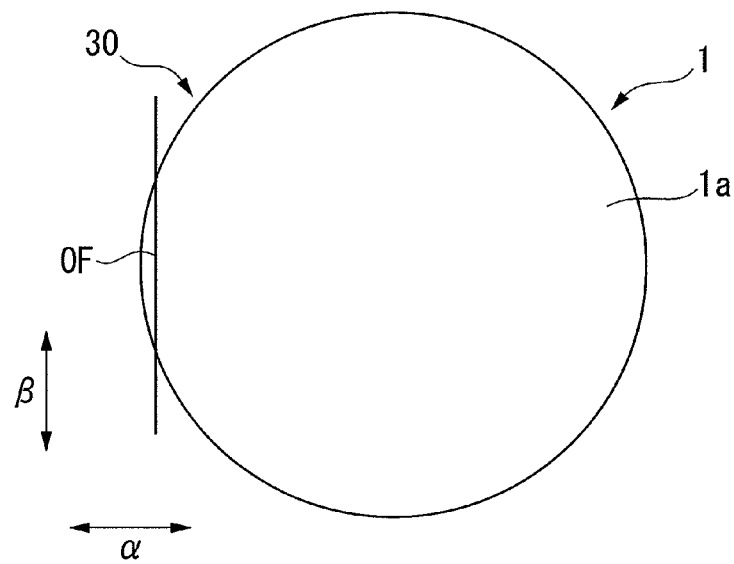
FIG. 2A is a diagram illustrating a process of the method of manufacturing a nitride semiconductor light-emitting device according to the embodiment.
Figure 2B:
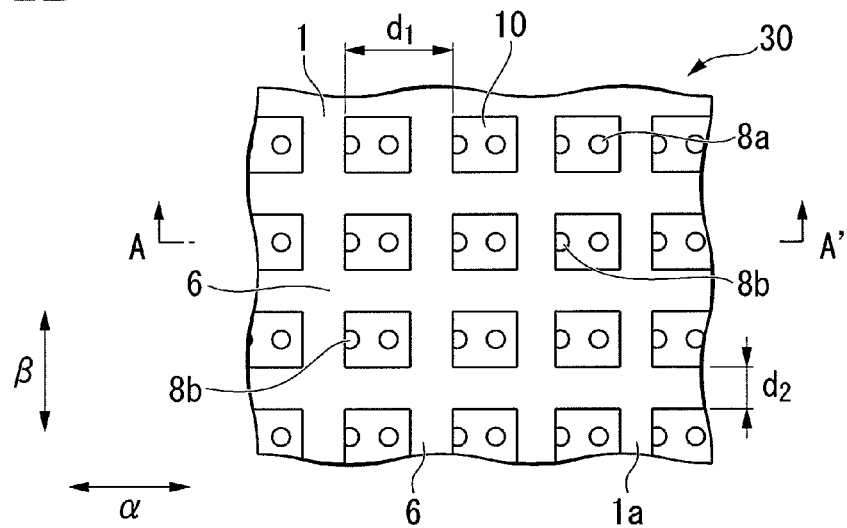
FIG. 2B is a diagram illustrating a process of the method of manufacturing a nitride semiconductor light-emitting device according to the embodiment.
Figure 2C:
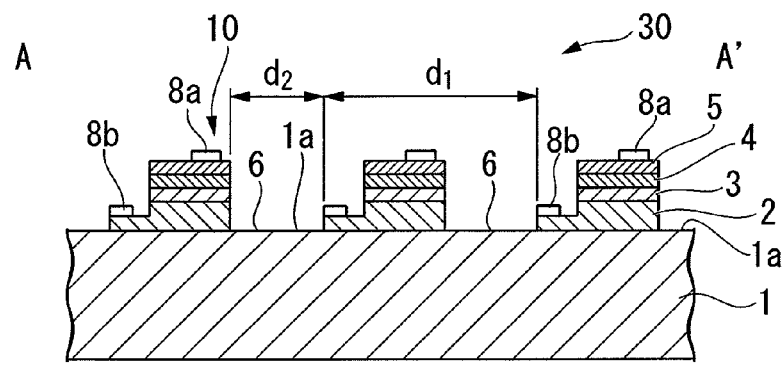
FIG. 2C is a diagram illustrating a process of the method of manufacturing a nitride semiconductor light-emitting device according to the embodiment.

FIGS. 2A to 2C are diagrams illustrating a process of the method of manufacturing a nitride semiconductor light-emitting device according to this embodiment. Specifically, FIG. 2A is a plan view illustrating a wafer, FIG. 2B is an enlarged plan view illustrating a portion of the wafer shown in FIG. 2A, and FIG. 2C is a cross-sectional view taken along the line A-A' of FIG. 2B. In FIG. 2A, for easy viewing of the drawings, an LED device structure and a separation region, which will be described below, are omitted.

Then, the epitaxial layer 7 on the substrate 1 having the positive electrode bonding pad 8a shown in FIG. 1 formed thereon is etched by a known photolithography technique and a known reactive ion etching technique to form grooves and a separation region 6 shown in FIGS. 2B and 2C and to expose the n-type contact layer of the n-type layer 2 in a semicircular shape at a predetermined position facing the separation region 6.

The separation region 6 is formed at a position including boundaries between device regions 15, which will be described below, that partition the LED device structures 10 in a lattice shape having a predetermined pitch $d_1$ and a predetermined width $d_2$ in a direction that is parallel to a first direction represented by an arrow α and in a second direction that is represented by an arrow β and is vertical to the first direction α in FIGS. 2A and 2B. In this embodiment, the first direction α is vertical to the orientation flat (11-20) plane, which is represented by "OF", of the substrate 1 in FIG. 2A.

The pitch $d_1$ of the separation region 6 shown in FIGS. 2B and 2C is appropriately determined by the size of a nitride semiconductor light-emitting device to be manufactured, and is in the range of, for example, 200 μm to 1200 μm. In addition, the width $d_2$ of the separation region 6 is in the range of 200 μm to 1200 μm.

Then, a negative electrode bonding pad 8b shown in FIGS. 2B and 2C is formed on the exposed n-type contact layer of the p-type layer 4. The negative electrode bonding pad 8b has various known compositions and structures using, for example, Ti or Au, without any restrictions. The negative electrode bonding pad may be formed by a means that has generally been known in this technical field.

In this way, a plurality of LED device structures 10 that are separated from each other by the separation region 6 are formed on the main surface 1a of the substrate 1, thereby manufacturing a wafer 30 shown in FIGS. 2A to 2C. Then, as shown in FIG. 3, the wafer 30 is partitioned into a plurality of device regions 15 each having the LED device structure 10. (Partition Process)

Figure 3A:
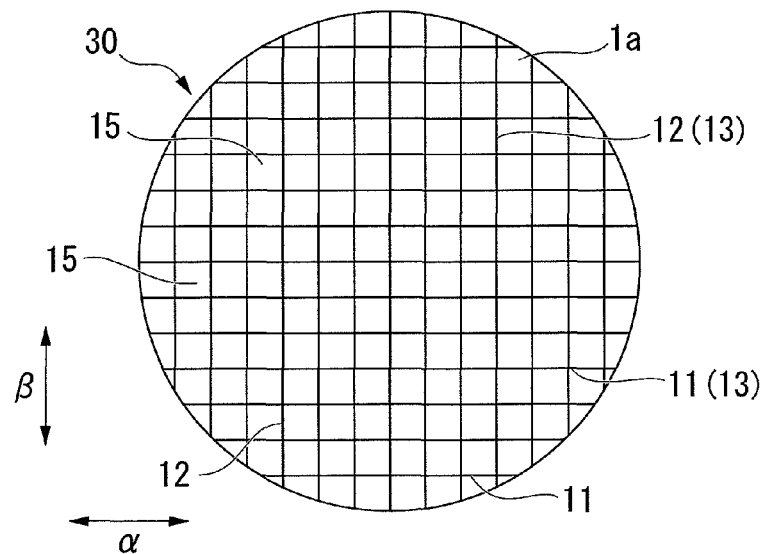
FIG. 3A is a diagram illustrating a process of the method of manufacturing a nitride semiconductor light-emitting device according to the embodiment.
Figure 3B:
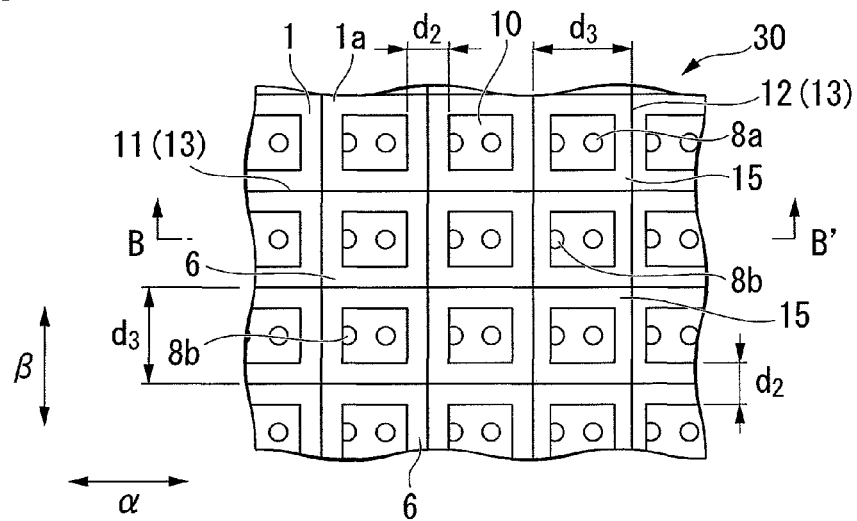
FIG. 3B is a diagram illustrating a process of the method of manufacturing a nitride semiconductor light-emitting device according to the embodiment.
Figure 3C:
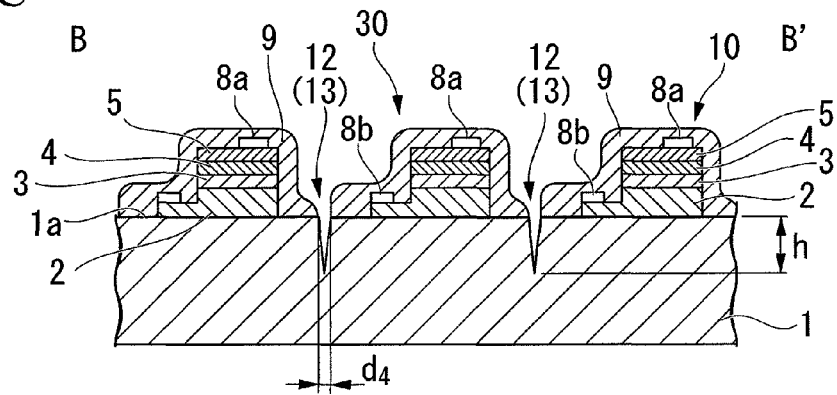
FIG. 3C is a diagram illustrating a process of the method of manufacturing a nitride semiconductor light-emitting device according to the embodiment.

FIG. 3 is a diagram illustrating a process of the method of manufacturing the nitride semiconductor light-emitting device according to this embodiment. Specifically, FIG. 3A is a plan view illustrating a wafer, FIG. 3B is an enlarged plan view illustrating a portion of the wafer shown in FIG. 3A, and FIG. 3C is a cross-sectional view taken along the line B-B' of FIG. 3B. In FIG. 3A, for easy viewing of the drawings, the LED device structure and the separation region are omitted. In FIGS. 3A and 3B, a protective film, which will be described below, is omitted.

In the partition process according to this embodiment, as shown in FIGS. 3A to 3C, half cut grooves 13 for separating the LED device structures 10 are provided to partition rectangular device regions 15.

In this embodiment, as shown in FIG. 3C, before the half cut grooves 13 are formed, it is preferable to form a protective film 9 on the surface of the wafer 3 having the LED device structures 10 formed thereon. When the half cut grooves 13 shown in FIGS. 3A to 3C are formed by, for example, a laser method, contaminants, such as Al, O, and Si, which are materials forming the LED device structures 10 and the substrate 1, are adhered to the wafer 30, and the emission efficiency of an LED device is likely to be lowered. As shown in FIG. 3C, before the half cut grooves 13 are formed, the protective film 9 that is removable after the half cut grooves 13 are formed is provided. In this way, it is possible to prevent the contamination of the wafer 30 due to the formation of the half cut grooves 13 by removing the protective film together with contaminant after the half cut grooves 13 are formed.

The protective film 9 may be formed of any material as long as it can be removed after the half cut grooves 13 are formed. For example, the protective film 9 may be formed of a resist, a transparent resin, glass, a metal material, or an insulating material.

For example, as the resist, a water-soluble resist used for photolithography may be used. As the transparent resin, any of the following materials may be used: acrylic resin, polyester, polyimide, vinyl chloride, and silicon resin. As the metal material, for example, nickel or titanium may be used. As the insulating material, for example, a silicon oxide or a silicon nitride may be used.

The protective film 9 may be formed by a known method, such as a coating method, a vapor deposition method, or a sputtering method.

The thickness of the protective film 9 is preferably in the range of 0.01 μm to 5 μm, more preferably, 0.01 μm to 1 μm. If the thickness of the protective film 9 is less than 0.01 μm, the protective film 9 may be damaged when the half cut grooves 13 are formed, and may not sufficiently protect the LED device structures 10. On the other hand, if the thickness of the protective film 9 is more than 5 μm, the protective film 9 may absorb a laser beam when the half cut grooves 13 are formed by a laser and be peeled off.

Then, as shown in FIGS. 3A to 3C, the half cut grooves 13 including a plurality of first division grooves 11 that are formed in parallel to the first direction represented by the arrow α and a plurality of second division grooves 12 that are formed in parallel to the second direction, which is represented by the arrow β, orthogonal to the first direction α are formed in the wafer 30. In this embodiment, the first direction α is vertical to the orientation flat (11-20) plane of the substrate 1.

As shown in FIGS. 3B and 3C, the half cut grooves 13 are formed in a lattice shape having a predetermined pitch $d_3$ and a predetermined width $d_4$. The pitch $d_3$ of the half cut groove 13 is equal to the pitch $d_1$ of the separation region 6, and is appropriately determined by the size of a nitride semiconductor light-emitting device to be manufactured.

The depth h of the half cut groove 13 shown in FIG. 3C is preferably in the range of 6 μm to 50 μm, more preferably, 10 μm to 40 μm, most preferably, 20 μm to 30 μm. If the depth h of the half cut groove 13 is more than 10 μm, it is possible to accurately control the shape of a compound semiconductor device after division. If the depth h of the half cut groove 13 is less than 6 μm, the cross-section of the LED device structure 10 is inclined when the wafer 30 is divided into the LED device structures 10, and the shapes of the divided compound semiconductor devices are irregular.

The width $d_4$ of the half cut groove 13 shown in FIG. 3C is preferably in the range of 3 to 50 μm since the half cut groove 13 has a predetermined depth h.

The half cut groove 13 may have various shapes, such as a rectangular shape, a U-shape, and a V-shape in a cross-sectional view. However, it is preferable that the half cut groove have a V-shape or a U-shape in a cross-sectional view. Among the shapes, as shown in FIG. 3C, it is more preferable that the half cut groove 13 have a V-shape in a cross-sectional view. When the half cut groove 13 is formed in a V-shape in a cross-sectional view, cracks are more likely to occur around the bottom of the V-shaped half cut groove 13 when the wafer 30 is divided into the LED device structures 10. Therefore, the compound semiconductor devices have a regular shape after the division, and a percent defective is lowered.

It is preferable that the half cut groove 13 be formed by a laser scriber using a laser beam. The laser scriber can easily form the half cut groove 13 with a desired depth. When the half cut groove 13 is formed by the laser scriber, it is possible to easily control the cross-sectional shape of the half cut groove 13 by controlling a laser optical system, such as the diameter of a beam and a focal position. In addition, when the laser scriber is used, it is possible to rapidly form the half cut groove 13, as compared to when an etching method is used. Further, when the laser scriber is used, a variation in processing accuracy due to the abrasion and deterioration of a blade or a diamond stylus is smaller than that when a general scribing method or a dicing method is used, and it is possible to reduce costs of replacing blades. The side surface of the half cut groove 13 formed by the laser scriber is observed by a differential interference optical microscope. As a result, it is observed that an uneven portion is formed in the side surface of the half cut groove. The uneven portion formed in the side surface of the half cut groove 13 makes it possible to improve the light emission efficiency of a divided compound semiconductor device. When the half cut grooves 13 are formed by the laser scriber, the depths h of the half cut grooves 13 are increased at intersections between the half cut grooves 13, that is, at the edges of the divided compound semiconductor devices. Therefore, it is possible to accurately divide the wafer 30.

Examples of a laser beam machine used for the laser scriber include a $CO_2$ laser, a YAG laser, an excimer laser, and a pulse laser. Among them, it is preferable to use the pulse laser.

For example, the wavelength of the laser may be 355 nm or 266 nm, or it may be shorter than these values. The frequency of the laser is preferably in the range of 1 to 100000 Hz, more preferably, 30000 to 70000 Hz. The power of the laser depends on the width $d_4$ and the depth h of the half cut groove 13. However, it is preferable that the laser have a minimum power required to obtain a desired half cut groove 13. When the power of the laser is high, the substrate 1 or the LED device structure 10 is thermally damaged. Therefore, the power of the laser is preferably not higher than 2 W, more preferably, not higher than 1 W.

In addition, it is possible to focus a laser beam radiated from the laser beam machine at a desired position by an optical system, such as a lens. It is preferable to focus the laser beam around the epitaxial layer 7, particularly, on the surface of the epitaxial layer 7.

After the half cut grooves 13 are completely formed, the protective film 9 that has been formed before the half cut grooves 13 are formed is removed together with contaminants adhered to the wafer 30 when the half cut grooves 13 are formed.

Then, a surface of the substrate 1 of the wafer 30 opposite to the main surface 1a is polished such that the thickness of the substrate 1 is in the range of 40 μm to 250 μm, preferably, 50 μm to 150 μm, more preferably, 60 μm to 90 μm. If the thickness of the substrate 1 is more than 250 μm, it is difficult to accurately divide the very hard substrate 1 made of, for example, sapphire. On the other hand, if the thickness of the substrate 1 is less than 80 μm, the substrate 1 is significantly curved due to the difference between the lattice constants or the thermal expansion coefficients of the substrate 1 and the epitaxial layer 7, and it is difficult to accurately divide the substrate 1. When the thickness of the substrate 1 is in the above-mentioned range, it is possible to easily divide the wafer 30. In addition, it is possible to effectively and clearly divide wafer 30.

Polishing may be performed to reduce the thickness of the substrate 1 before a division process is performed, which will be described below, before the half cut grooves 13 are formed in the wafer 30, or after the half cut grooves 13 are formed in the wafer 30.

However, for example, if the thickness of the epitaxial layer 7 is more than 5 μm, it is preferable to perform polishing to reduce the thickness of the substrate 1 after the half cut grooves 13 are formed. As the thickness of the epitaxial layer 7 is increased, the bending of the wafer 30 when the thickness of the substrate 1 is small is increased. When the bending of the wafer 30 is increased, it may be difficult to form the half cut grooves 13. For this reason, if the thickness of the epitaxial layer 7 is not less than 5 μm, it is preferable to perform polishing to reduce the thickness of the substrate 1 after the half cut grooves 13 are formed.

Then, the surface of the substrate 1 of the wafer 30 opposite to the main surface 1a is polished into a mirror surface. In general, the surface of the wafer 30 having the epitaxial layer 7 formed thereon is curved in a concave shape. It is possible to adjust the bending of the wafer 30 by controlling the roughness of the surface of the substrate 1 opposite to the main surface 1a. That is, as the roughness Ra (roughness average) of the substrate 1 is increased, the flatness of the wafer 30 is increased. The roughness average Ra is preferably not less than 0.001 μm, more preferably, not less than 0.01 μm.

However, if the roughness average Ra is excessively large, the epitaxial layer 7 is curved in a concave shape in the reverse direction. Therefore, the roughness average Ra is preferably not more than 2 μ, more preferably, not more than 0.3 μm.

As in this embodiment, the half cut grooves 13 may be formed in the surface of the wafer 30 on which the LED device structures 10 are formed, or they may be formed in the substrate 1 of the wafer 30. Alternatively, the half cut grooves 13 may be formed in both the LED device structures 10 and the substrate 1. However, when the surface of the substrate 1 opposite to the main surface 1a is polished after the half cut grooves 13 are formed, it is preferable to form the half cut grooves 13 in the LED device structures 10. When the half cut grooves are formed in the substrate 1 of the wafer 30, it is preferable to form the protective film 9 on the substrate 1 of the wafer 30 before the half cut grooves are formed.

In this embodiment, in the partition process, the half cut grooves 13 are formed. However, the partition process may not form the half cut grooves 13, but determine the position of each device portion.

Then, the wafer 30 shown in FIG. 3A is divided into the device regions 15, thereby manufacturing group-III nitride semiconductor light-emitting devices in the LED device structures 10.

(Division Process)

In this embodiment, before the division process is performed, a sheet is adhered to the LED device regions of the wafer such that the divided compound semiconductor devices are not scattered.

Figure 4A:
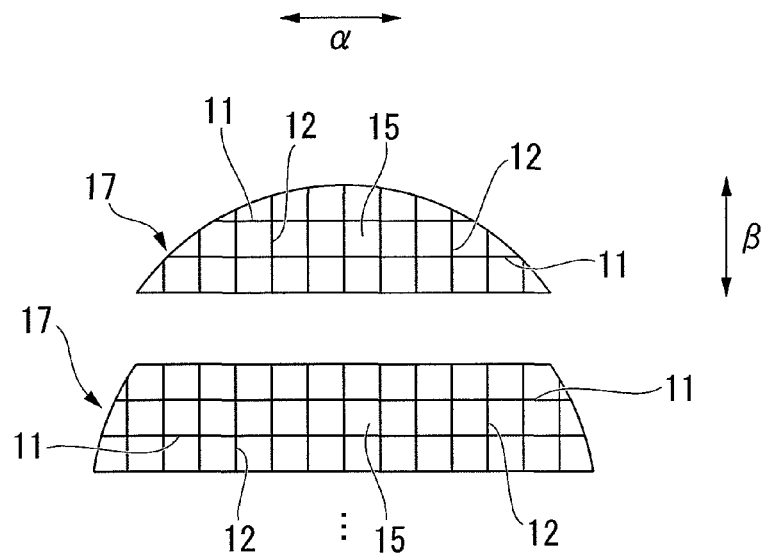
FIG. 4A is a diagram illustrating a process of the method of manufacturing a nitride semiconductor light-emitting device according to the embodiment.

Then, during the division process, first, as shown in FIG. 4A, the wafer 30 is divided into first strip wafers 17 along the first division grooves 11 that extend in parallel to the first direction α (first division process).

Figure 4B:
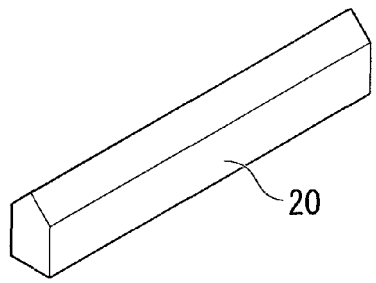
FIG. 4B is a diagram illustrating a process of the method of manufacturing a nitride semiconductor light-emitting device according to the embodiment.
Figure 4C:
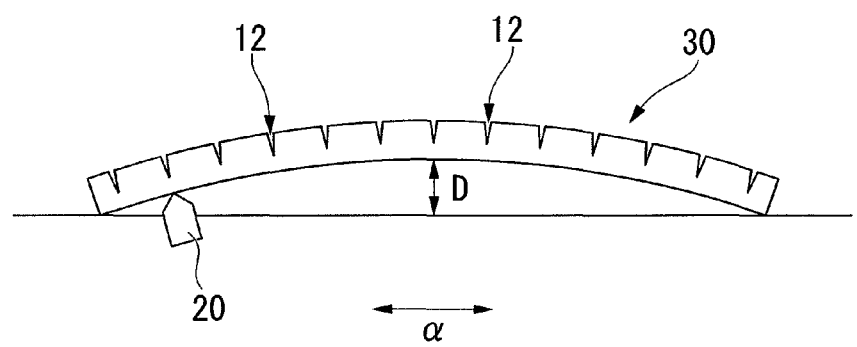
FIG. 4C is a diagram illustrating a process of the method of manufacturing a nitride semiconductor light-emitting device according to the embodiment.

In this case, for example, a knife 20 can be used to divide the wafer 30. As shown in FIG. 4B, the knife 20 has a linear blade that is made of, for example, Zr and has a triangular shape in a cross-sectional view. As shown in FIG. 4C, the blade of the knife 20 is located at a position corresponding to the first division groove 11 on the surface of the substrate 1 of the wafer 30 using, for example, a camera, and comes into contact with the substrate 1 of the wafer 30 along the first division groove 11. Then, the knife 20 is pressed against the substrate 1. Then, cracks occur along the first division grooves 11 and the wafer 30 is divided.

The depth of notches formed in the wafer 30 by the knife 20 is preferably in the range of 10 μm to 150 μm, more preferably, 10 μm to 40 μm. If the depth of the notch formed in the wafer 30 by the knife 20 is less than 10 μm, the wafer may not be divided. On the other hand, if the depth of the notch formed in the wafer 30 by the knife 20 is more than 150 μm, distortion may occur in the half cut grooves 13, which results in misalignment between the divided devices or cracks. In addition, if the depth of the notch formed in the wafer 30 by the knife 20 is more than 150 μm, the sheet adhered to the LED device regions of the wafer is also cut before the division process. In this case, the divided compound semiconductor devices are likely to be scattered.

The first strip wafer 17 includes at least two rows (three rows in FIG. 4A) of LED device structures 10 arranged in the first direction α. It is preferable that the first strip wafer include two to five rows of LED device structures 10 arranged in the first direction α.

If the first strip wafer 17 includes one row of LED device structures 10 arranged in the first direction α, the width thereof in the second direction β becomes small, and a large distortion occurs in the substrate 1 in the first direction α. FIG. 4C is a cross-sectional view illustrating the wafer 30 in the first direction α. As shown in FIG. 4C, when the wafer 30 with a diameter of 2 inches is manufactured by forming the LED device structures 10 and the half cut grooves 13 and polishing the substrate 1 to a predetermined thickness, the wafer is curved about 30 μm to 40 μm as represented by D. In the state shown in FIG. 4C, the bending of the wafer 30 is not so significant to divide the wafer 30. The reason is that the distortion of the wafer 30 is not concentrated in one direction, but is dispersed in all directions by all the device regions 15 connected to each other on the circular wafer 30. However, in the first division process, as shown in FIG. 4A, when the wafer 30 is divided in the first direction α, the distortion of the substrate in the first direction α is increased, and the bending of the wafer 30 becomes significant. For example, when the first strip wafer 17 includes one row of LED device structures 10 arranged in the first direction α, the distortion of the substrate in the first direction is increased, which makes it difficult to divide the wafer in the second direction β.

Even though the first strip wafer 17 includes five or more rows of LED device structures 10 arranged in the first direction α, there is no variation in the effect of reducing the bending of the first strip wafer 17. However, when the first strip wafer 17 includes five or more rows of LED device structures 10 arranged in the first direction α, the distortion of a second strip wafer, which will be described below, is increased, which is not preferable.

In the first division process, it is preferable to divide the wafer 30 starting from the shortest first division groove 11. When the wafer 30 is divided starting from the shortest first division groove 11, it is possible to effectively prevent the cracks of the wafer 30 during the first division process.

Figure 5A:
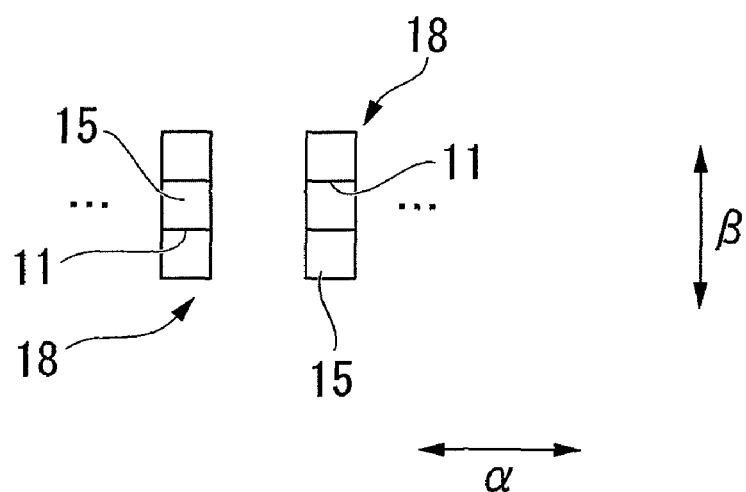
FIG. 5A is a diagram illustrating a process of the method of manufacturing a nitride semiconductor light-emitting device according to the embodiment.

Then, similar to the first division process, the knife 20 shown in FIG. 4B is positioned using a camera, comes into contact with a portion of the substrate 1 corresponding to the first strip wafer 17 along the second division groove 12. Then, the knife 20 is pressed against the substrate 1. Then, cracks occur along the second division grooves 12, and the first strip wafer 17 is divided into second strip wafers 18, each having a row of LED device structures 10 arranged in the second direction β, along the second division grooves 12, as shown in FIG. 5A (second division process).

Figure 5B:
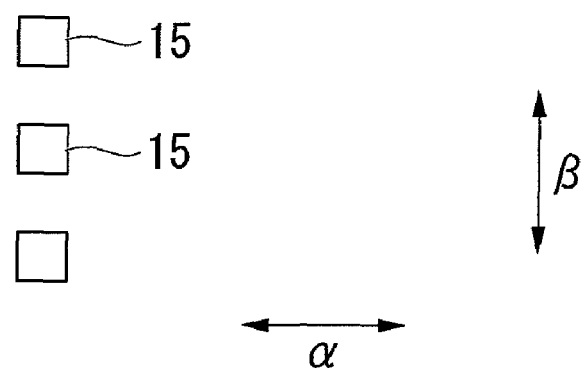
FIG. 5B is a diagram illustrating a process of the method of manufacturing a nitride semiconductor light-emitting device according to the embodiment.

Then, similar to the first division process, the knife 20 shown in FIG. 4B is positioned using a camera, comes into contact with a portion of the substrate 1 corresponding to the second strip wafer 18 along the first division groove 11. Then, the knife 20 is pressed against the substrate 1. Then, cracks occur along the first division grooves 11, and the second strip wafer 18 is divided into the device regions 15 along the first division grooves 11, as shown in FIG. 5B, thereby forming the group-III nitride semiconductor light-emitting devices having the LED device structures 10 (third division process).

In the method of manufacturing the compound semiconductor device according to this embodiment, the division process includes: the first division process of dividing the wafer 30 in the first direction α to obtain the first strip wafers 17 each having at least two rows of LED device structures 10 arranged in the first direction α; the second division process of dividing the first strip wafer 17 in the second direction β orthogonal to the first direction α to obtain the second strip wafers 18 each having a row of LED device structures 10 arranged in the second direction β; and the third division process of dividing the second strip wafer 18 into the LED device structures 10, thereby forming the group-III nitride semiconductor light-emitting devices including the LED device structures 10. Therefore, according to the manufacturing method, it is possible to divide the wafer 30 with a small curvature. As a result, it is possible to accurately divide the wafer 30. Even when a sapphire substrate is used as the substrate 1 and the epitaxial layer 7 made of a group-III nitride semiconductor having a lattice constant that is greatly different from that of the sapphire substrate is formed on the sapphire substrate, it is possible to manufacture compound semiconductor devices having a regular shape with high yield.

EXAMPLES

Next, the present invention will be described in detail with reference to Examples and Comparative Examples. However, the present invention is not limited to Examples.

Example 1

As a compound semiconductor device, a group-III nitride semiconductor light-emitting device including the LED device structure having a gallium nitride compound semiconductor was manufactured as follows. First, a plurality of LED device structures were formed on the main surface of a substrate, thereby manufacturing a wafer.
(Device Forming Process)
An epitaxial layer that was made of a group-III nitride semiconductor and had a thickness of 9 μm was manufactured by sequentially laminating, on the main surface of a C-plane sapphire substrate having an outside diameter of 250 μm, an undoped GaN underlying layer with a thickness of 4 μm, a Si-doped (concentration=$1\times10^{19}$/cm$^3$) n-type GaN contact layer with a thickness of 2 μm, a Si-doped (concentration=$1\times10^{18}$/cm$^3$) n-type $In_{0.1}Ga_{0.9}N$ clad layer with a thickness of 12.5 nm, a light-emitting layer having a multiple quantum well structure, a Mg-doped (concentration=$1\times10^{20}$/cm$^3$) p-type $Al_{0.07}Ga_{0.93}N$ clad layer with a thickness of 2.5 nm, and a Mg-doped (concentration=$8\times10^{19}$/cm$^3$) p-type GaN contact layer with a thickness of 0.15 μm, with a buffer layer formed of AlN interposed therebetween. The light-emitting layer was formed by alternately laminating GaN barrier layers each having a thickness of 16 nm and $In_{0.2}Ga_{0.8}N$ well layers each having a thickness of 2.5 nm five times, and the barrier layers were provided on the outer sides of the light emitting layer.

Then, a translucent positive electrode having a laminated structure of Au and NiO films formed on the p-type contact layer was formed at a predetermined position of the p-type contact layer of the epitaxial layer by a known photolithography technique and a known lift-off technique. Then, a positive electrode bonding pad having a laminated structure of Ti, Al, Ti, and Au layers was formed on the semiconductor layer by a known photolithography technique.

The transmittance of the translucent positive electrode manufactured by the above-mentioned method with respect to light having a wavelength of 470 nm was 60%. The transmittance was measured using a translucent electrode that had the same structure as the translucent positive electrode and had a sufficient size to measure the transmittance.

Then, the epitaxial layer of the substrate having the positive electrode bonding pad formed thereon was etched by a known photolithography technique and a known reactive ion etching method to form a separation region including grooves having a pitch of 350 μm, a width of 20 μm, and a depth of 1 μm and to expose the n-type contact layer in a semicircular shape at a predetermined position facing the separation region. Then, a negative electrode bonding pad having a two-layer structure of Ti and Au layers was formed on the exposed n-type contact layer by a known method. In this way, a plurality of LED device structures separated from each other by the separation region were formed on the substrate, thereby manufacturing a wafer for a light-emitting device.

Then, a plurality of device regions each having one LED device structure were partitioned on the wafer.

(Partition Process)
First, a water-soluble resist was uniformly coated on the entire surface of the wafer on which the LED device structures were formed by a spin coater, and dried, thereby forming the protective film 9 with a thickness of 0.2 μm. Then, a UV tape was adhered to the substrate of the wafer, and the resist was cleaned to peel off the UV tape.

Then, the wafer was fixed on a stage of a pulse laser beam machine by a vacuum chuck. The stage was movable in the X-axis (right-left direction) and the Y-axis (front-rear) direction and was rotatable. After the wafer was fixed, a laser optical system was adjusted to focus a laser beam on the surface of the epitaxial layer of the groove, thereby forming, in the bottoms of the grooves, the first division grooves that had a V-shape in a cross-sectional view and had a pitch of 350 μm, a width of 5 μm, and a depth of 20 μm in the surface of the substrate in a direction (first direction) that is vertical to the orientation flat (11-20) plane of the sapphire substrate. In this case, the laser had a wavelength of 266 nm, a frequency of 50 kHz, and a power of 1.6 W. Under these conditions, good first division grooves were formed at a process speed of 70 mm/s. In addition, the stage was rotated 90° to form the second division grooves in the second direction vertical to the first direction by the same method as described above. In this way, the half cut grooves including the first division grooves and the second division grooves were formed. After the half cut grooves were formed, the vacuum chuck was released to remove the wafer from the stage.

Then, the wafer was loaded on a cleaner stage, and shower water flowed on the surface of the LED device structure while rotating the wafer to remove the protective film formed before the half cut grooves were formed. Then, the cleaner stage was rotated at a high speed to remove the shower water, thereby drying the wafer.

Then, the sapphire substrate of the wafer was lapped and polished to reduce the thickness of the sapphire substrate such that the sum of the thickness of the epitaxial layer and the thickness of the substrate was 80 μm. The roughness average Ra of the rear surface of the substrate was 0.005 μm.

It was observed by eyes that there was no contaminant on the surface of the wafer having the LED device structures formed thereon. Then, the wafer was divided into device regions, thereby obtaining group-III nitride semiconductor light-emitting devices each having an LED device structure.
(Division Process)
Before the division process was performed, a sheet was adhered to the LED device regions of the wafer. Then, the wafer was divided along the first division grooves, starting from the shortest first division groove, thereby obtaining the first strip wafers, each having two rows of LED device structures arranged in the first direction α (first division process). The wafer was divided as follows: a knife that was made of Zr came into contact with the substrate of the wafer along the first division grooves, and was pressed against the substrate. In this case, the depth of the notch formed in the wafer by the knife was 40 μm. Then, cracks occurred along the first division grooves and the wafer was divided.

Then, a knife that was made of Zr came into contact with the substrate of the first strip wafer along the second division grooves, and was pressed against the substrate. In this case, the depth of the notch formed in the wafer by the knife was 40 μm. Then, cracks occurred along the second division grooves. In this way, the first strip wafer was divided into the second strip wafers, each having a row of LED device structures arranged in the second direction β, along the second division grooves (second division process).

Then, a knife that was made of Zr came into contact with the substrate of the second strip wafer along the first division grooves, and was pressed against the substrate. In this case, the depth of the notch formed in the wafer by the knife was 40 µm. Then, cracks occurred along the first division grooves. In this way, the second strip wafer was divided into device regions along the first division grooves, thereby obtaining individual chips (group-III nitride semiconductor light-emitting devices) with a 350 µm square, each having the LED device structure (third division process).

Integrating sphere measurement was performed on each bare chip obtained in Example 1. As a result, when a current of 20 mA was applied, emission power was 5.1 mW.

Examples 2 to 5 and Comparative Example 1

In Examples 2 to 5 and Comparative Example 1, chips were manufactured, similar to Example 1, except that, in first division process, the first strip wafer having the number of rows of LED device structures shown in Table 1 was formed in the first direction α and the depth of the notch formed in the wafer by the knife was set as in Table 1.

TABLE 1

|  | Number of rows of LED device structures | Depth of notch formed in wafer (µm) | Yield (%) |
|---|---|---|---|
| Comparative Example 1 | 1 | 40 | 85 |
| Example 1 | 2 | 40 | 88 |
| Example 2 | 3 | 30 | 92 |
| Example 3 | 4 | 20 | 97 |
| Example 4 | 5 | 10 | 99 |
| Example 5 | 6 | 10 | 97 |

In Examples 1 to 5 and Comparative Example 1, the percentage of chips without any appearance defect among the manufactured chips, that is, yield was measured. The measurement results are shown in Table 1.

As can be seen from Table 1, in the chip according to Comparative Example 1 in which the first strip wafer includes one row of LED device structures arranged in the first direction α, the yield is lower than those of the chips according to Examples 1 to 5.

In addition, in the chip according to Example 5 in which the first strip wafer includes six rows of LED device structures arranged in the first direction α, the yield is lower than that of the chip according to Example 4 in which the first strip wafer includes five rows of LED device structures arranged in the first direction α. It is considered that, when the number of rows of LED device structures arranged in the first direction α in the first strip wafer is larger than 5, the distortion of the second strip wafer is increased, which results in low yield.

In Examples 1 to 4 in which the first strip wafer includes two to five rows of LED device structures, as the number of rows of LED device structures is increased, the yield is increased.

Example 6

The same partition process as that in Example 1 was performed on the wafer obtained by the same method as that in Example 1. Then, the division process was performed.

Figure 6:
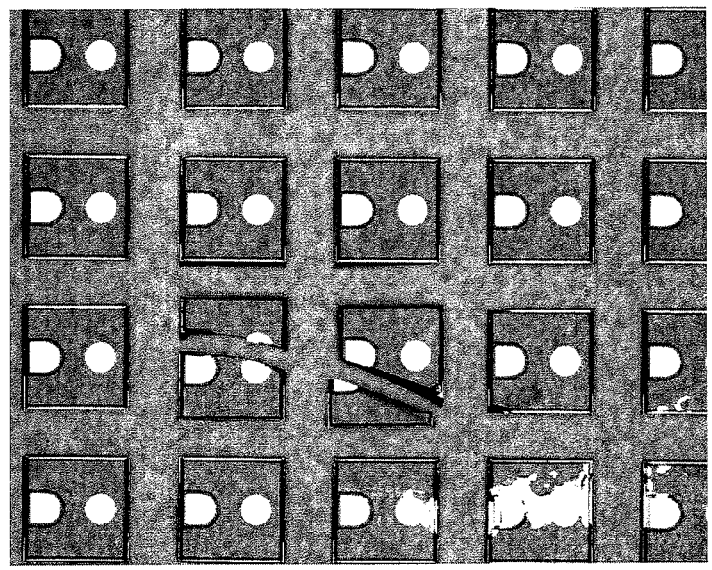
FIG. 6 is a photograph showing cracks occurred in a wafer.

Cracks occurred in the wafer are shown in FIG. 6. FIG. 6 is a photograph showing the cracks occurred in the wafer.

Comparative Example 2

The same partition process as that in Example 1 was performed on the wafer obtained by the same method as that in Example 1. Then, the division process was performed, similar to Example 6, except that the first strip wafer includes one row of LED device structures arranged in the first direction α.

Figure 7:
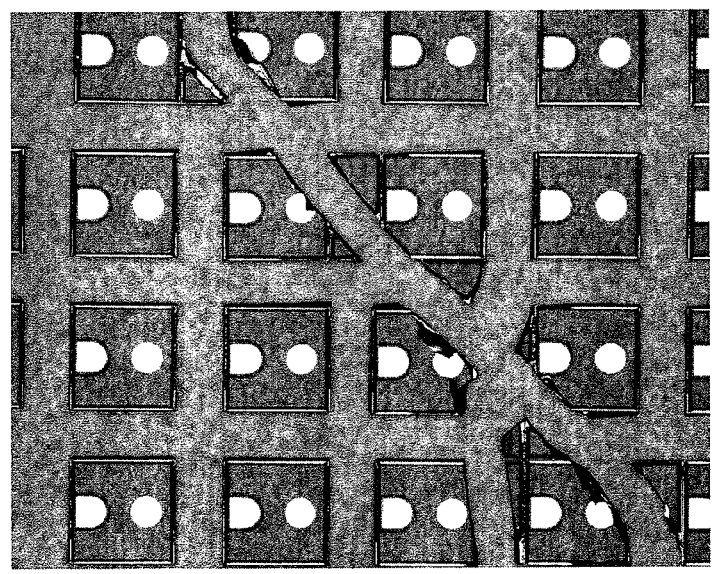
FIG. 7 is a photograph showing cracks occurred in a wafer.

Cracks occurred in the wafer are shown in FIG. 7. FIG. 7 is a photograph showing the cracks occurred in the wafer.

As can be seen from FIGS. 6 and 7, in Example 6, the first strip wafer includes two rows of LED device structures arranged in the first direction α. Therefore, distortion is reduced, and the crack is shorter than that in Comparative Example 2.

INDUSTRIAL APPLICABILITY

According to the manufacturing method of the present invention, it is possible to manufacture a compound semiconductor device with high yield, and the industrial applicability of the method of manufacturing a compound semiconductor device is very high.

The invention claimed is:

1. A method of manufacturing a compound semiconductor device comprising:
   a device forming step of forming a plurality of device portions on a main surface of a substrate in a matrix in a first direction and a second direction that is orthogonal to the first direction, thereby forming a wafer; and
   a division step of dividing the wafer into the device portions, thereby forming the compound semiconductor devices,
   wherein the division step includes:
   a first division step of dividing the wafer in the first direction to obtain first strip wafers each having at least two rows of the device portions arranged in the first direction;
   a second division step of dividing the first strip wafer in the second direction to obtain second strip wafers each having a row of the device portions arranged in the second direction;
   a third division step of dividing the second strip wafer into the device portions, thereby forming the compound semiconductor devices including the device portions; and
   a partition step of forming half cut grooves for separating the device portions in the main surface of the substrate in the first and second directions between the device forming step and the division step,
   wherein, in the division step, a knife is pressed against the wafer along the half cut grooves such that cracks occur along the half cut grooves, thereby dividing the wafer into the first strip wafers or the second strip wafers.

2. The method of manufacturing the compound semiconductor device according to claim 1,
   wherein the half cut grooves are formed by a laser method.

3. The method of manufacturing the compound semiconductor device according to claim 1,
   wherein the first strip wafer includes two to five rows of the device portions arranged in the first direction.

4. The method of manufacturing the compound semiconductor device according to claim 1,
   wherein the substrate is a sapphire substrate,
   the main surface is a C-plane, and
   the first direction is vertical to a (11-20) plane.

5. The method of manufacturing the compound semiconductor device according to claim 1, further comprising:

a step of polishing a surface of the substrate opposite to the main surface such that the thickness of the substrate is in the range of 60 μm to 90 μm, before the division step.

6. The method of manufacturing the compound semiconductor device according to claim 1, wherein the compound semiconductor device is a group-III nitride semiconductor light-emitting device.

* * * * *